(12) United States Patent
Basker et al.

(10) Patent No.: US 9,378,952 B1
(45) Date of Patent: Jun. 28, 2016

(54) TALL RELAXED HIGH PERCENTAGE SILICON GERMANIUM FINS ON INSULATOR

(71) Applicant: International Business Machines Corporation, Armonk, NY (US)

(72) Inventors: Veeraraghavan S. Basker, Schenectady, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/871,008

(22) Filed: Sep. 30, 2015

(51) Int. Cl.
| | |
|---|---|
| *H01L 21/00* | (2006.01) |
| *H01L 21/02* | (2006.01) |
| *H01L 21/311* | (2006.01) |
| *H01L 21/283* | (2006.01) |

(52) U.S. Cl.
CPC .... *H01L 21/02675* (2013.01); *H01L 21/02532* (2013.01); *H01L 21/02617* (2013.01); *H01L 21/02694* (2013.01); *H01L 21/283* (2013.01); *H01L 21/31111* (2013.01); *H01L 21/31144* (2013.01)

(58) Field of Classification Search
CPC ............. H01L 21/823431; H01L 21/823828; H01L 21/845; H01L 27/0886; H01L 27/0924; H01L 27/10826; H01L 27/10882; H01L 27/1214; H01L 29/41791; H01L 29/66803; H01L 29/785; H01L 2924/13067
USPC .......... 438/149, 509, 595; 257/190, 288, 289, 257/347
See application file for complete search history.

(56) References Cited

U.S. PATENT DOCUMENTS

| | | | |
|---|---|---|---|
| 8,685,842 B2 | 4/2014 | Oda et al. | |
| 8,847,281 B2 | 9/2014 | Cea et al. | |
| 8,951,870 B2 | 2/2015 | Basker et al. | |
| 2014/0027860 A1 | 1/2014 | Glass et al. | |
| 2014/0099774 A1 | 4/2014 | Vincent | |
| 2014/0264600 A1* | 9/2014 | Adam | H01L 29/785 257/347 |
| 2015/0008484 A1 | 1/2015 | Cea et al. | |
| 2015/0069465 A1* | 3/2015 | Cheng | H01L 29/36 257/190 |
| 2015/0097270 A1 | 4/2015 | Bedell et al. | |

FOREIGN PATENT DOCUMENTS

JP       201496565 A       5/2014

* cited by examiner

*Primary Examiner* — Brook Kebede
(74) *Attorney, Agent, or Firm* — Scully, Scott, Murphy & Presser, P.C.; Daniel P. Morris, Esq.

(57) ABSTRACT

A method is provided for forming tall silicon germanium alloy fin structures on a surface of an insulator layer. The silicon germanium alloy fin structures have a high germanium content (i.e., 50 atomic percent or greater), a low defect density (i.e., 1E2 or less defects per square cm) and a high relaxation value (i.e., 80% or greater).

20 Claims, 13 Drawing Sheets

TALL RELAXED HIGH PERCENTAGE SILICON GERMANIUM FINS ON INSULATOR

BACKGROUND

The present application relates to semiconductor technology, and more particularly, to a method of forming a semiconductor structure containing at least one silicon germanium alloy fin structure that has a high percentage of germanium and located on a surface of an insulator layer.

For more than three decades, the continued miniaturization of metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that MOSFETs are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs), is the next step in the evolution of complementary metal oxide semiconductor (CMOS) devices. Semiconductor FinFETs can achieve higher drive currents with increasingly smaller dimensions as compared to conventional planar FETs.

In such FinFET devices, a fin containing a silicon germanium alloy is one promising channel material because of its high-carrier mobility. Silicon germanium alloy fins can be formed by epitaxially growing a silicon germanium alloy layer on a surface of a silicon (Si) substrate and then patterning the silicon germanium alloy layer. This prior art method of forming silicon germanium alloy fins has some drawbacks associated therewith. For example, the direct epitaxial growth of a silicon germanium alloy on a Si substrate has a critical thickness limit. Above the critical thickness, silicon germanium is very defective and is not suitable for use as a device channel material. This prevents a thick silicon germanium alloy layer for high fin heights. Moreover, this approach is not scalable for silicon germanium alloy fins having a high (i.e., greater than 70 atomic %) germanium content. Such silicon germanium alloy fins are also formed on a silicon substrate. For future technology nodes, it oftentimes required that the silicon germanium alloy fin be present on an insulator layer, rather than a silicon substrate.

In view of the above, there is a need for providing a method of forming a silicon germanium alloy fin having a high germanium content, a low defect density, and a high relaxation value and on a surface of an insulator layer.

SUMMARY

The present application provides a method of forming tall silicon germanium alloy fin structures on a surface of an insulator layer. The silicon germanium alloy fin structures have a high germanium content (i.e., 50 atomic percent or greater), a low defect density (i.e., from 1E2 defects per square cm or less) and a high relaxation value (i.e., 80% or greater).

In one aspect of the present application, a method of forming a semiconductor structure is provided. In one embodiment of the present application, the method includes forming an epitaxial semiconductor material fin stack comprising, from bottom to top, a first silicon germanium alloy fin portion of a first germanium content, a silicon fin portion and a second silicon germanium alloy fin portion of the first germanium content within at least one opening formed within a patterned material stack. The patterned material stack comprises, from bottom to top, first hard mask portions and second hard mask portions. The at least one opening exposes a surface of a silicon substrate. Next, an anchoring structure is formed on the patterned material stack and the epitaxial semiconductor material stack. Each first hard mask portion and the first silicon germanium alloy fin portion are thereafter replaced with an insulator layer. The anchoring structure is then removed. Next, a flash laser anneal is performed to melt and recrystallize the second silicon germanium alloy fin portion and to provide a silicon germanium alloy pre-fin structure having the first germanium content. A thermal mixing process is then performed to convert the silicon germanium alloy pre-fin structure and the silicon fin portion into a silicon germanium alloy fin structure having a second germanium content that is less than the first germanium content.

DETAILED DESCRIPTION

Figure 1A:
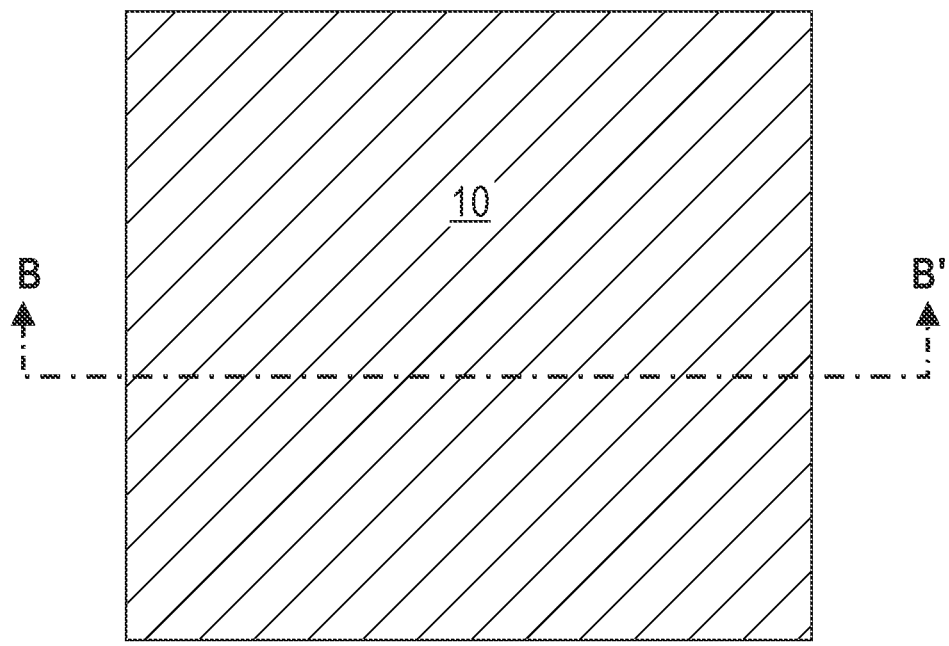
FIG. 1A is a top down view of an exemplary semiconductor structure including a silicon substrate that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1B:
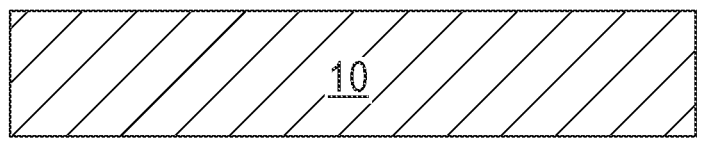
FIG. 1B is a cross sectional view of the exemplary semiconductor structure of FIG. 1A along vertical plane B-B'.

Referring first to FIGS. 1A-1B, there are illustrated various views of an exemplary semiconductor structure including a silicon substrate 10 that can be employed in accordance with an embodiment of the present application. The silicon substrate 10 is typically single crystalline and it is generally intrinsic (i.e., non-doped).

In one embodiment of the present application, the silicon substrate 10 represents the entirety of a bulk semiconductor substrate. By "bulk semiconductor substrate" it is meant that the entire substrate is composed of at least one semiconductor material. In another embodiment, the silicon substrate 10 represents an uppermost semiconductor layer of a bulk semiconductor substrate. The remaining portion of the bulk semiconductor substrate may include one or more semiconductor materials such as, for example, Si, Ge, SiGe, SiC, SiGeC, III-V compound semiconductors or II-VI compound semiconductors located beneath the silicon substrate 10 shown in FIGS. 1A-1B.

In other embodiments, the silicon substrate 10 may be a topmost semiconductor layer of a silicon-on-insulator (SOI) substrate that further includes an insulator layer (not shown) located beneath the silicon substrate 10 and a handle substrate (also not shown) located beneath the insulator layer. The handle substrate provides mechanical support for the insulator layer and the silicon substrate 10. In some embodiments, the handle substrate may be a semiconductor material such as, for example, Si, Ge, SiC, SiGeC, III-V compound semiconductors or II-VI compound semiconductors. Multilayers of these semiconductor materials can also be used as the semiconductor material of the handle substrate. In one embodiment, the handle substrate also comprises silicon. In some embodiments, the handle substrate is a non-semiconductor material including, for example, a dielectric material and/or a conductive material.

The handle substrate and the silicon substrate 10 may have the same or different crystal orientation. For example, the crystal orientation of the handle substrate and/or the silicon substrate 10 may be {100}, {110}, or {111}. Other crystallographic orientations besides those specifically mentioned can also be used in the present application. The handle substrate may be a single crystalline semiconductor material, a polycrystalline material, or an amorphous material.

The insulator layer of the SOI substrate may be a crystalline or non-crystalline oxide or nitride. In one embodiment, the insulator layer of the SOI substrate is an oxide such as, for example, silicon dioxide. In another embodiment, the insulator layer of the SOI substrate is a nitride such as, for example, silicon nitride or boron nitride. In yet other embodiments, the insulator layer of the SOI substrate is a multilayered stack of, in any order, silicon dioxide and boron nitride.

When an SOI substrate is employed, the SOI substrate can be formed utilizing processes well known to those skilled in the art including, for example, Separation by IMplantation of OXygen (SIMOX) or a layer transfer process that includes bonding of a silicon wafer to a semiconductor wafer wherein an insulator layer is present on at least one of the silicon wafer or the semiconductor wafer.

Figure 2A:
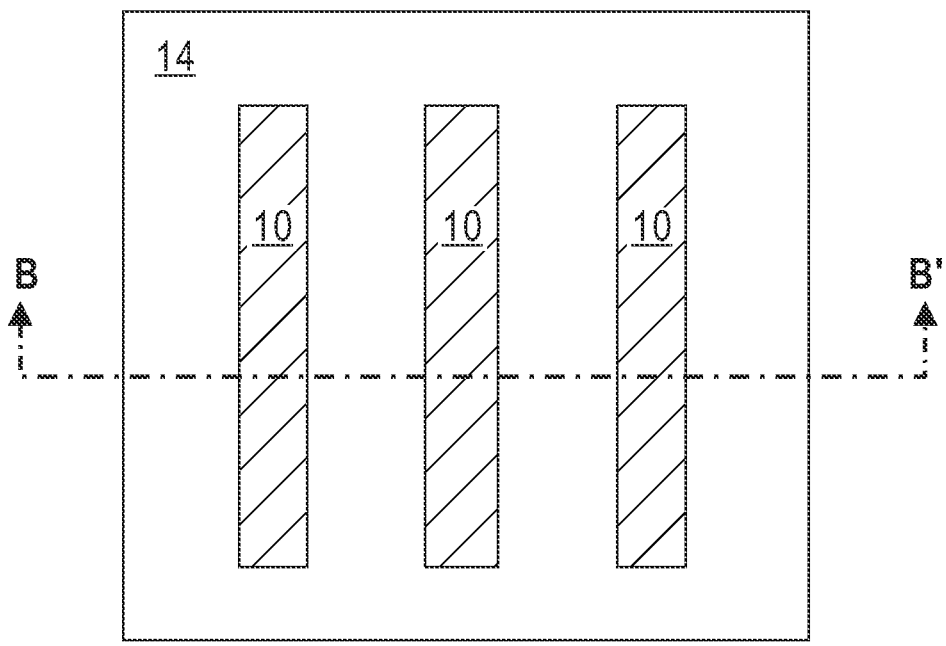
FIG. 2A is a top down view of the exemplary semiconductor structure of FIGS. 1A-1B after forming a patterned material stack including, from bottom to top, first hard mask portions and second hard mask portions on the silicon substrate, wherein the patterned material stack contains at least one opening that exposes a surface of the silicon substrate.
Figure 2B:
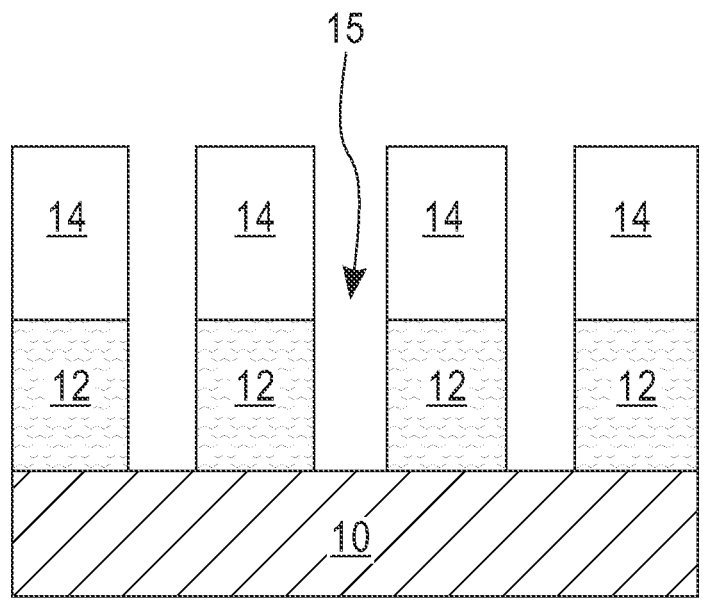
FIG. 2B is a cross sectional view of the exemplary semiconductor structure of FIG. 2A along vertical plane B-B'.

Referring now to FIGS. 2A-2B, there are illustrated various views of the exemplary semiconductor structure of FIGS. 1A-1B after forming a patterned material stack including, from bottom to top, first hard mask portions 12 and second hard mask portions 14 on the silicon substrate 10, wherein the patterned material stack (12, 14) contains at least one opening 15 that exposes a surface of silicon substrate 10. Each opening 15 that is formed has an aspect ratio of 1:3 or greater. Each opening 15 that is formed is used in the present application to trap defects of a subsequently grown silicon germanium alloy fin portion at a bottom of the opening 15.

The patterned material stack can be formed by first providing a contiguous layer of a first hard mask material on a surface of the silicon substrate 10. The term "contiguous" denotes that a material layer entirely covers, without any breaks or interruptions, an underlying material layer. The first hard mask material is used to provide each first hard mask portions 12 mentioned above. The first hard mask material can include silicon dioxide, silicon nitride, or silicon oxynitride. In one embodiment, the first hard mask material is comprised of silicon dioxide. The layer of first hard mask material can be formed utilizing a conventional deposition process such as, for example, chemical vapor deposition or plasma enhanced chemical vapor deposition. The layer of first hard mask material can have a thickness from 5 nm to 20 nm. Other thicknesses that are lesser than, or greater than, the aforementioned thickness range can also be employed as the thickness of the layer of first hard mask material.

Next, a contiguous layer of a second hard mask material is formed on a surface of the contiguous layer of first hard mask material. The second hard mask material is used to provide the second hard mask portions 14 mentioned above. In accordance with the present application, the second hard mask material comprises a different hard mask material than the first hard material. In one example, and when the first hard mask material comprises silicon dioxide, then the second hard mask material comprises silicon nitride or silicon oxynitride. The layer of second hard mask material can be formed utilizing a conventional deposition process such as, for example, chemical vapor deposition or plasma enhanced chemical vapor deposition. The layer of second hard mask material can have a thickness from 5 nm to 20 nm. Other thicknesses that are lesser than, or greater than, the aforementioned thickness range can also be employed as the thickness of the layer of second hard mask material.

After providing the material stack including the layer of first hard mask material and the layer of second hard mask material, the material stack is then subjected to a patterning process that forms the at least one opening 15 that extends entirely through the material stack to a surface of the underlying silicon substrate 10.

In one embodiment of the present application, the material stack may be patterned by lithography and etching. Lithography includes forming a photoresist material (not shown) atop a material or material stack to be patterned; in the present application, the photoresist material is formed atop the material stack of, from bottom to top, the layer of the first hard mask material and the layer of second hard mask material. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the contiguous layer of hard mask material. The pattern provided by the patterned photoresist material is thereafter transferred into the underlying material layer or material layers (i.e., the first and second hard mask materials) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After the pattern transfer etch, portions of the layer of the second hard mask material remain, while portions of the layer of the first hard mask material remain. Each remaining portion of the layer of second hard mask material can be referred to herein as a second hard mask portion 14, while each remaining portion of the layer of first hard mask material can be referred to herein as a first hard mask portion 12. As is shown, the first and second hard mask portions (12, 14) have sidewall surfaces that are vertically coincident to each other. By "vertically coincident" it is meant that a sidewall surface of one material is vertically aligned to a sidewall surface of an underlying material.

In another embodiment, the patterning process may include a sidewall image transfer (SIT) process. The SIT process includes forming a mandrel material layer (not shown) atop the material or material layers (i.e., first and second hard mask materials) that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

Figure 3A:
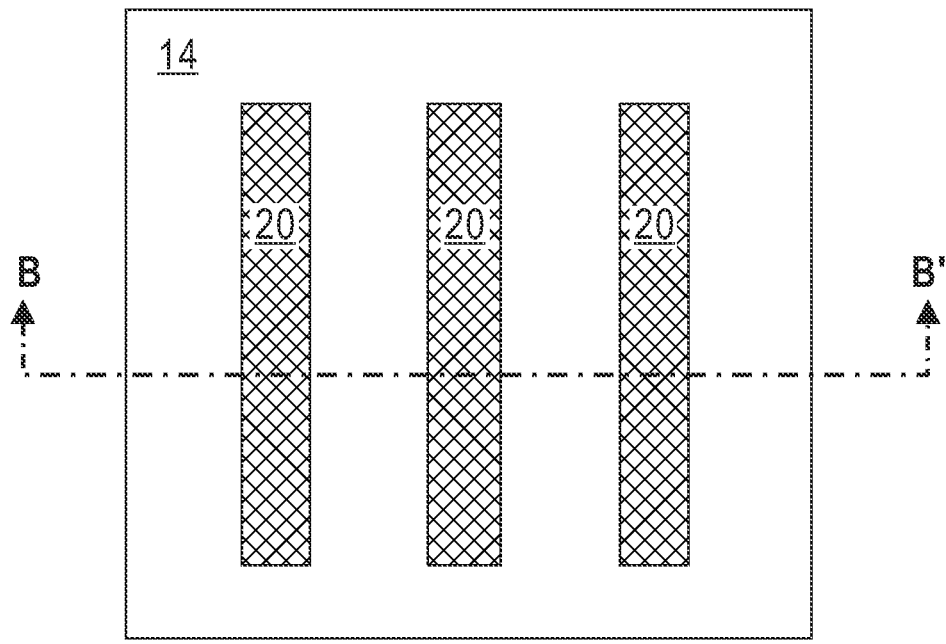
FIG. 3A is a top down view of the exemplary semiconductor structure of FIGS. 2A-2B after forming an epitaxial semiconductor material fin stack within the at least one opening, wherein the epitaxial semiconductor material fin stack includes, from bottom to top, a first silicon germanium alloy fin portion having a first germanium content, a silicon fin portion, and a second silicon germanium alloy fin portion having the first germanium content.
Figure 3B:
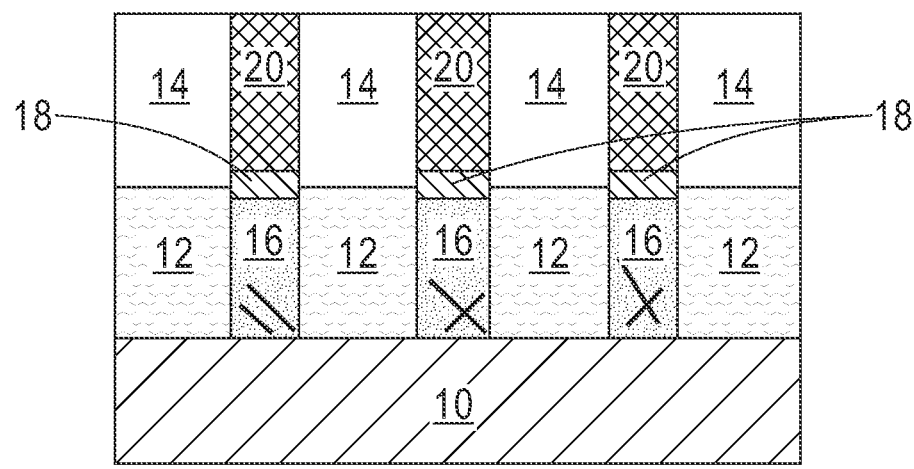
FIG. 3B is a cross sectional view of the exemplary semiconductor structure of FIG. 3A along vertical plane B-B'.

Referring now to FIGS. 3A-3B, there are illustrated various views of the exemplary semiconductor structure of FIGS. 2A-2B after forming an epitaxial semiconductor material fin stack within the at least one opening 15, wherein the epitaxial semiconductor material fin stack includes, from bottom to top, a first silicon germanium alloy fin portion 16 having a first germanium content, a silicon fin portion 18, and a second silicon germanium alloy fin portion 20 having the first germanium content. In accordance with the present application, the first and second silicon germanium alloy fin portions (16, 20) have a relaxation value of from 80% to 100%. As is shown, the silicon fin portion 18 has a topmost surface that is located above an interface formed between the first and second hard mask portions (12, 14) and a bottommost surface that is located below this same interface. As is further shown, sidewall surfaces of the first silicon germanium alloy fin portion 16, the silicon fin portion 18, and the second silicon germanium alloy fin portion 20 are vertically coincident with each other.

In accordance with the present application, the first silicon germanium alloy fin portion 16 has a first defect density, while the second silicon germanium alloy fin portion 20 has a second defect density that is less than the first defect density. In one example, the first defect density can be from 1E8 defects per square cm to 1E10 defects per square cm, while the second defect density is from 1E4 defects per square cm to 1E7 defects per square cm. Because of the aspect ratio of the opening 15, the defects within the first silicon germanium alloy fin portion 16 get trapped along the sidewalls of each first hard mask portion 12.

In accordance with the present application, the first germanium content of the first and second silicon germanium alloy fin portions (16, 20) can be greater than 50 atomic percent germanium. In one embodiment, the first germanium content of the first and second silicon germanium alloy fin portions (16, 20) can be in a range from 55 atomic percent germanium to 90 atomic percent germanium.

The first silicon germanium alloy fin portion 16, the silicon fin portion 18, and the second silicon germanium alloy fin portion 20 can be formed utilizing an epitaxial growth (or deposition) process such as the epitaxial regrowth process disclosed in U.S. Patent Application Publication No. 2011/0049568 to Lochtefeld et al., the entire content of which is incorporated herein by reference.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the first silicon germanium alloy fin portion 16 has an epitaxial relationship with the underlying silicon substrate 10, the silicon fin portion 18 has an epitaxial relationship with the underlying first silicon germanium alloy fin portion 16, and the second silicon germanium alloy fin portion 20 has an epitaxial relationship with the underlying silicon fin portion 18.

Examples of various epitaxial growth process apparatuses that are suitable for use in forming the epitaxial material fin stack (16, 18, 20) described above include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. In some embodiments, a vacuum is maintained throughout the entire formation of the epitaxial material fin stack (16, 18, 20). In other embodiments, the vacuum may be broken and a new vacuum may be reestablished between at least one of the epitaxial growth of the first silicon germanium alloy fin portion 16 and the silicon fin portion 18, or between the silicon fin portion 18 and the second silicon germanium alloy fin portion 20.

A number of different sources may be used for the deposition of the first and second silicon germanium alloy fin portions (16, 20) including a mixture of a silicon containing gas source and a germanium containing gas source or a combined silicon and germanium source gas may be used. Carrier gases like hydrogen, nitrogen, helium and argon can be used. Examples of silicon source gases include a silicon containing gas source. Examples of silicon gas sources include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases include germane, digermane, halogermane, dichlorogermane, and/or trichlorogermane. The silicon fin portion 18 can be formed utilizing one of the silicon containing gas sources mentioned above. Carrier gases like hydrogen, nitrogen, helium and argon can be used.

In one embodiment, the epitaxial semiconductor material fin stack can be formed by first epitaxial depositing the first silicon germanium alloy fin portion 16 utilizing a first silicon source and a first germanium source. After formation of the first silicon germanium alloy fin portion 16, the germanium source gas used to provide the first silicon germanium alloy fin potion 16 is removed, and the silicon fin portion 18 is formed utilizing only the first silicon source mentioned above. After formation of the silicon fin portion 18, the first germanium source gas is reintroduced into the silicon source gas to provide the second silicon germanium alloy fin portion 20. A purge is typically performed between the epitaxial growth of each semiconductor material. A planarization process such as, for example, chemical mechanical polishing, may then be performed to provide the exemplary semiconductor structure illustrated in FIGS. 3A-3B In some embodiments of the present application, the selected crystallographic direction of the first silicon germanium alloy fin portion 16 is aligned with at least one propagation direction of threading dislocations in the opening 15. Threading dislocations in this region may substantially terminate at the sidewall of the neighboring first hard mask portion 12. In one embodiment of the present application, the selected crystallographic direction of the silicon substrate 10 is aligned with direction of propagation of threading dislocations in the first silicon germanium alloy fin portion 16. In certain embodiments, the orientation angle ranges from about 30 to about 60 degrees, for example, is about 45 degrees to such crystallographic direction. As mentioned above, the surface of the silicon substrate 110 may have (100), (110), or (111) crystallographic orientation. In some embodiments, the selected crystallographic direction is substantially aligned with a <110> crystallographic direction of the first silicon substrate 10.

In one embodiment of the present application, the first silicon germanium alloy fin portion 16 has a height from 50 nm to 100 nm. Other heights that are greater than, or lesser than the aforementioned height can also be used as the height of the first silicon germanium alloy fin portion so long as the selected height is less than the thickness of each first hard mask portion 12.

In one embodiment of the present application, the silicon fin portion 18 has a height from 2 nm to 6 nm. Other heights that are greater than, or lesser than the aforementioned height can also be used as the height of the silicon fin portion 18 so long as the selected height provides a silicon fin portion that is located between the topmost surface of each first hard mask portion 12 and a bottommost surface of each second hard mask portion 14.

In one embodiment of the present application, the second silicon germanium alloy fin portion 20 has a height from 30 nm to 60 nm. Other heights that are greater than, or lesser than the aforementioned height can also be used as the height of the second silicon germanium alloy fin portion 20 so long as the selected height provides a second silicon germanium alloy fin portion 20 whose topmost surface is at least coplanar with a topmost surface of each second hard mask portion 14.

Figure 4A:
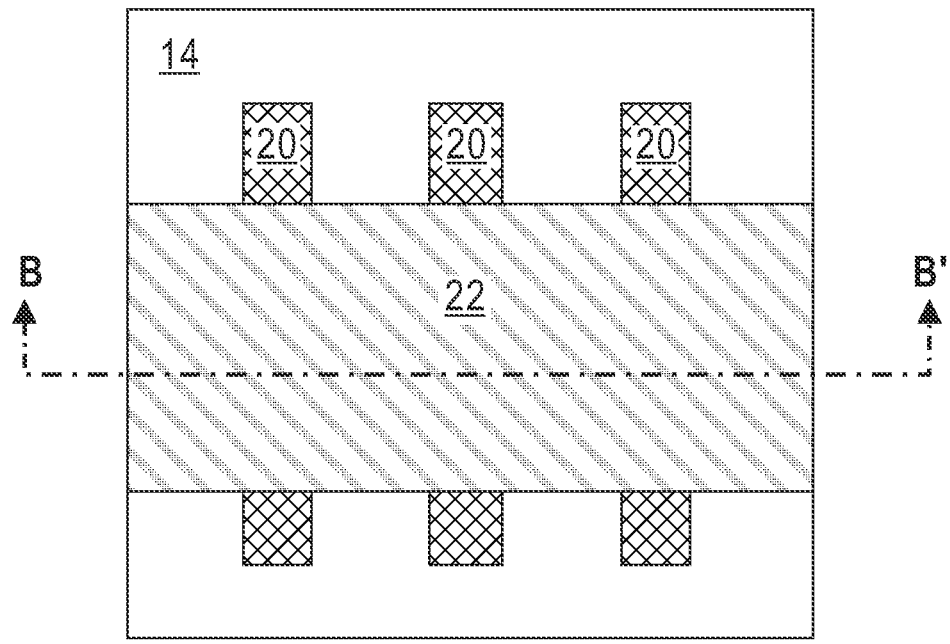
FIG. 4A is a top down view of the exemplary semiconductor structure of FIGS. 3A-3B after forming an anchoring structure atop the patterned material stack and the epitaxial semiconductor material fin stack.
Figure 4B:
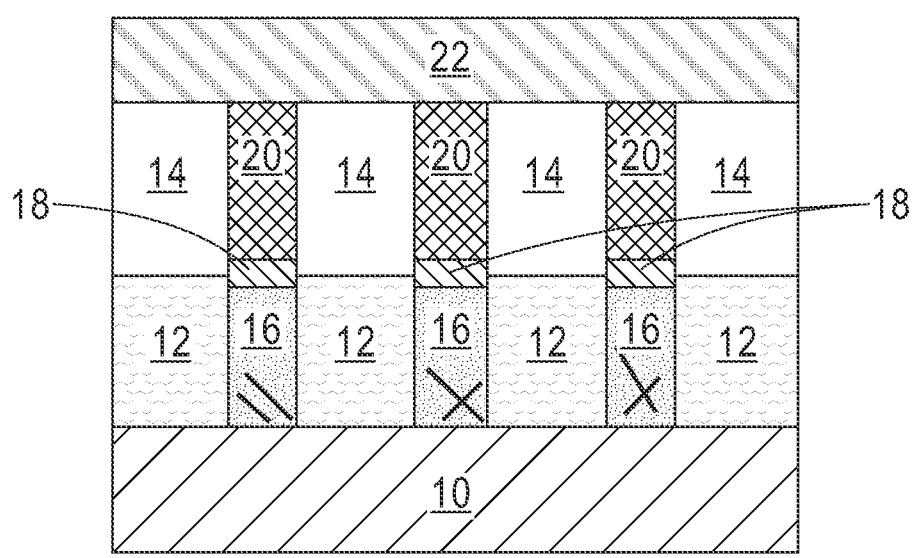
FIG. 4B is a cross sectional view of the exemplary semiconductor structure of FIG. 4A along vertical plane B-B'.

Referring now to FIGS. 4A-4B, there are illustrated various views of the exemplary semiconductor structure of FIGS. 3A-3B after forming an anchoring structure 22 atop the patterned material stack (12, 14) and the epitaxial semiconductor material fin stack (16, 18, 20). The anchoring structure 22 may include any sacrificial material that has a different etch rate than that of the first and second hard mask portions (12, 14) and the semiconductor materials that provide the epitaxial semiconductor material fin stack. In one embodiment of the present application, the anchoring structure 22 may comprise doped or undoped polysilicon. In another embodiment of the present application, the anchoring structure 22 may comprise doped or undoped amorphous silicon. In yet another embodiment, the anchoring structure 22 may comprise a metal.

The anchoring structure 22 can be formed by first depositing a sacrificial material. When doped, the dopant can be introduced into the sacrificial material during the deposition process or after utilizing one of ion implantation or gas phase doping. Following the deposition process and optional dopant introduction, the sacrificial material may be patterned utilizing lithography and etching as mentioned above to provide the anchoring structure 22.

Figure 5A:
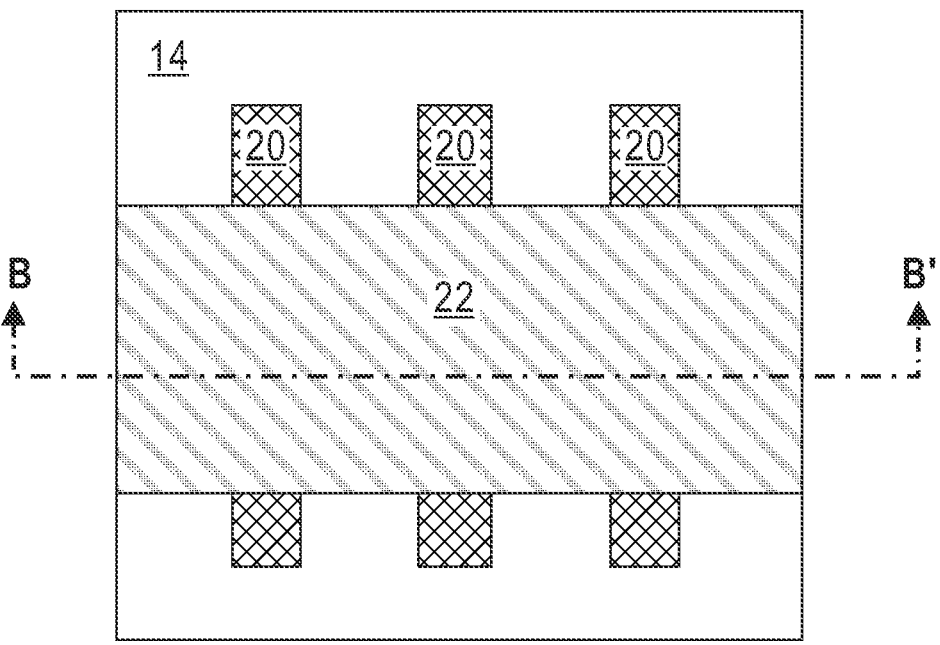
FIG. 5A is a top down view of the exemplary semiconductor structure of FIGS. 4A-4B after removing each first hard mask portion of the patterned material stack.
Figure 5B:
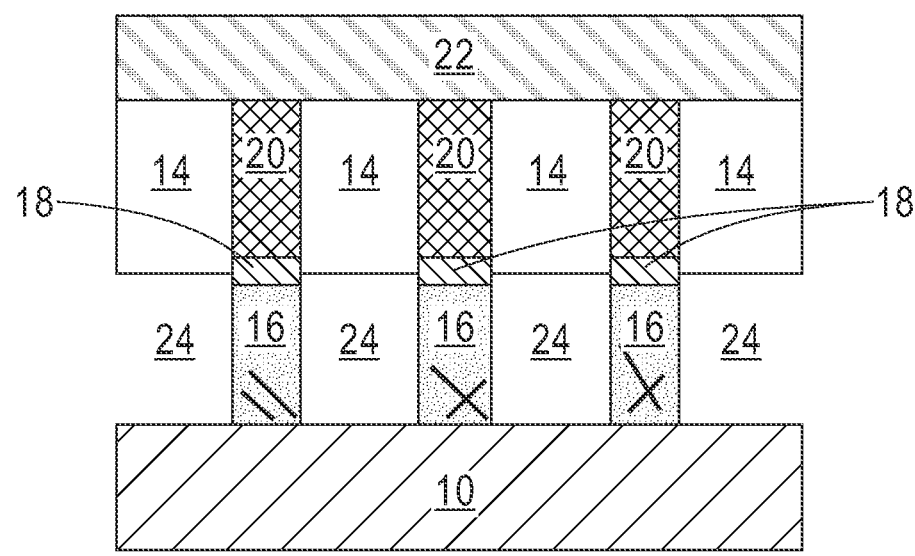
FIG. 5B is a cross sectional view of the exemplary semiconductor structure of FIG. 5A along vertical plane B-B'.

Referring now to FIGS. 5A-5B, there are illustrated various views of the exemplary semiconductor structure of FIGS. 4A-4B after removing each first hard mask portion 12 of the patterned material stack (12, 14). The removal of each first hard mask portion 12 of the patterned material stack (12, 14) provides an opening 24 adjacent the first silicon germanium alloy fin portion 16 and beneath each second hard mask portion 14. The removal of each first hard mask portion 12 is performed while the anchoring structure 22 is present atop each second hard mask portion 14 and the epitaxial semiconductor material fin stack (16, 18, 20). The removal of each first hard mask portion 12 exposes a bottommost surface of each second hard mask portion 14, and a topmost surface of the silicon substrate 10. The removal of each first hard mask portion 12 exposes the entirety of the sidewall surfaces of the first silicon germanium alloy fin portion 16 and portions of the sidewall surfaces of the silicon fin portion 18; other portions of the sidewall surface of the silicon fin portion 18 remain protected by each second hard mask portion 14.

The removal of each first hard mask portion 12 may be performed utilizing a directional etching process in which the sidewalls of each first hard mask portion 12 are first attacked by the etchant. The etchant utilizing in removing each first hard mask portion 12 is selective for removing the hard mask material that provides each first hard mask portion 12 relative to each second hard mask portion 14, the anchoring structure 22, and the semiconductor materials that provide the epitaxial semiconductor material fin stack (16, 18, 20). In one embodiment, and when each first hard mask portion 12 comprises silicon dioxide, and each second hard mask portion 18 comprises silicon nitride, hydrofluoric acid (HF) or a buffered oxide etch including ammonium fluoride ($NH_4F$) and HF may be used to remove each first hard mask portion 12 from the exemplary semiconductor structure.

Figure 6A:
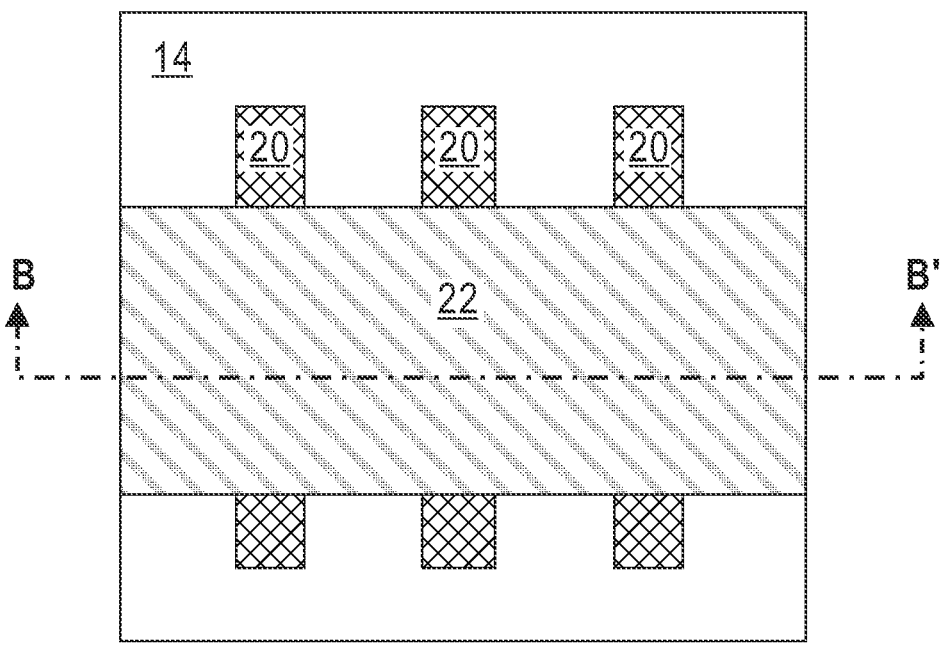
FIG. 6A is a top down view of the exemplary semiconductor structure of FIGS. 5A-5B after removing the first silicon germanium alloy fin portion of the epitaxial semiconductor material fin stack.
Figure 6B:
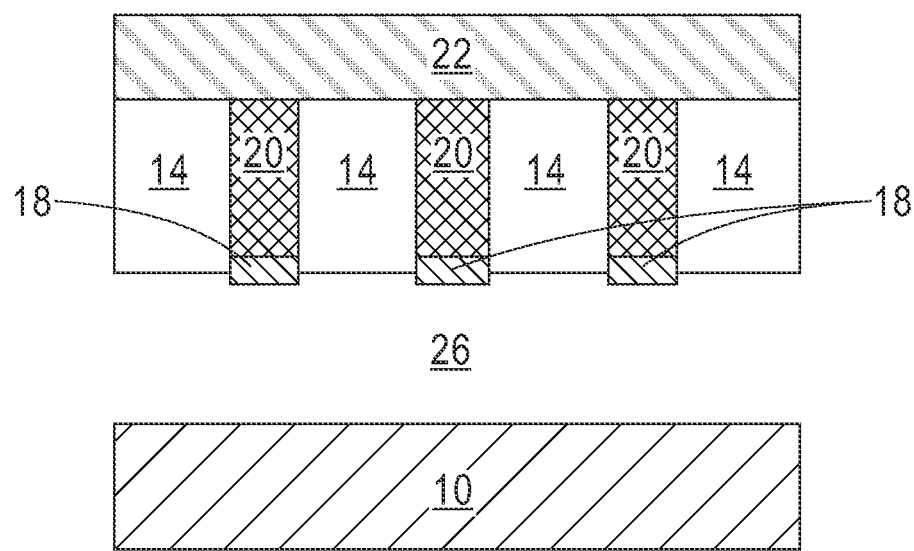
FIG. 6B is a cross sectional view of the exemplary semiconductor structure of FIG. 6A along vertical plane B-B'.

Referring now to FIGS. 6A-6B, there are illustrated various views of the exemplary semiconductor structure of FIGS. 5A-5B after removing the first silicon germanium alloy fin portion 16 of the epitaxial semiconductor material fin stack (16, 18, 20). The removal of the first silicon germanium alloy fin portion 16 of the epitaxial semiconductor material fin stack (16, 18, 20) provides a gap 26 located between the silicon substrate 10 and each second hard mask portion 14 and the remaining portions, i.e., the silicon fin portion 18, and the second silicon germanium alloy fin portion 20, of the epitaxial semiconductor material fin stack (16, 18, 20). The removal of the first silicon germanium alloy fin portion 16 of the epitaxial semiconductor material fin stack (16, 18, 20) is performed with the anchoring structure 22 still atop each second hard mask portion 14 and the second silicon germanium alloy fin portion 20. The removal of the first silicon germanium alloy fin portion 16 exposes a bottommost surface and portions of the sidewall surfaces of the silicon fin portion 18.

The removal of first silicon germanium alloy fin portion 16 of the epitaxial semiconductor material fin stack (16, 18, 20) can be performed utilizing an etching process that is selective in removing a silicon germanium alloy as compared to silicon, each second hard mask portion 14 and the anchoring structure 22. In one example, $H_2O_2$ can be used as the etchant for removing the first silicon germanium alloy fin portion 16 of the epitaxial semiconductor material fin stack (16, 18, 20).

Figure 7A:
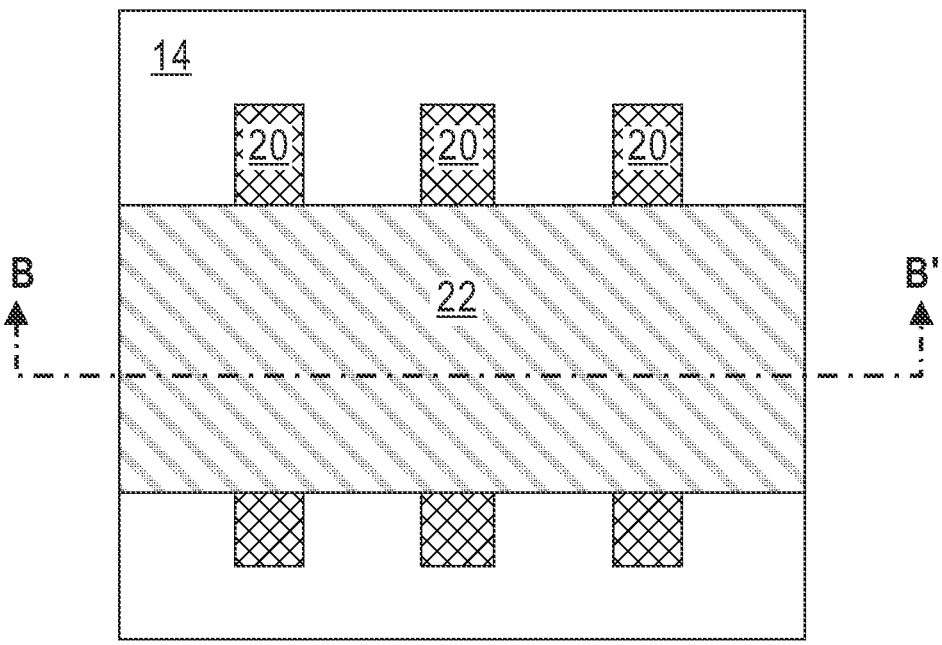
FIG. 7A is a top down view of the exemplary semiconductor structure of FIGS. 6A-6B after filling a gap beneath each second hard mask portion and the silicon fin portion with an insulator layer.
Figure 7B:
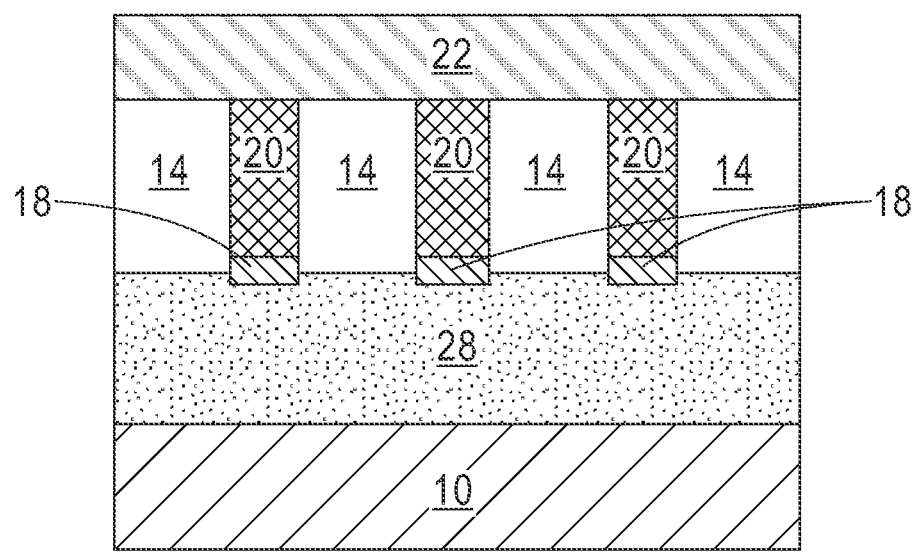
FIG. 7B is a cross sectional view of the exemplary semiconductor structure of FIG. 7A along vertical plane B-B'.

Referring now to FIGS. 7A-7B, there are illustrated various views of the exemplary semiconductor structure of FIGS. 6A-6B after filling the gap 26 beneath each second hard mask portion 14 and the silicon fin portion 18 with an insulator layer 28. As is shown, the entirety of gap 26 is filled with the insulator layer 28.

The insulator layer 28 that is formed comprises a different dielectric material than each second hard mask portion 14, and the anchoring structure 22. In one embodiment, the insulator layer 28 is a flowable oxide such as, for example, silicon dioxide. The insulator layer 28 can be formed utilizing a deposition process such as, for example, chemical vapor deposition or plasma enhanced chemical vapor deposition.

Figure 8A:
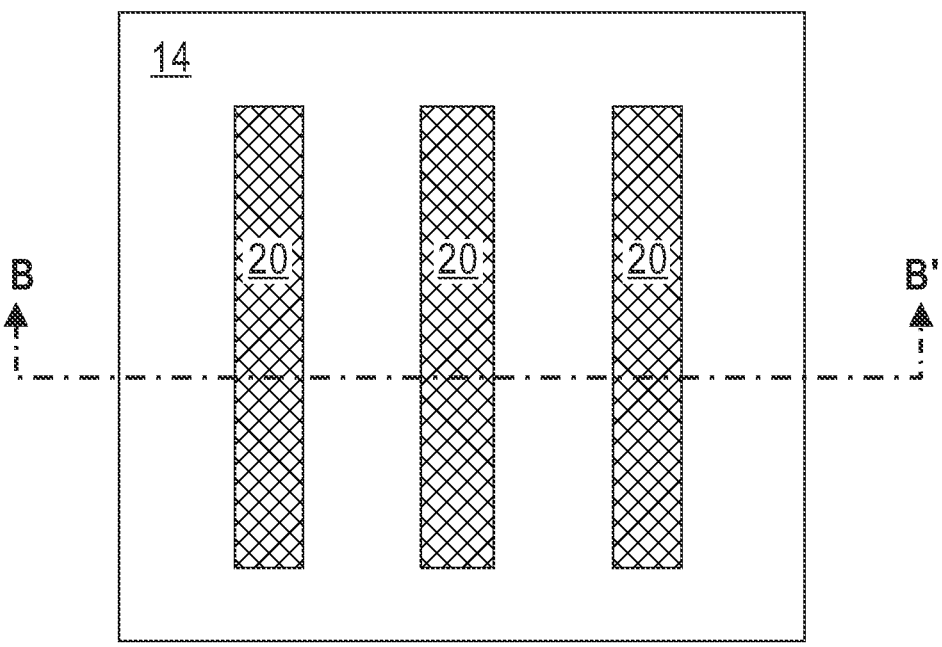
FIG. 8A is a top down view of the exemplary semiconductor structure of FIGS. 7A-7B after removing the anchoring structure.
Figure 8B:
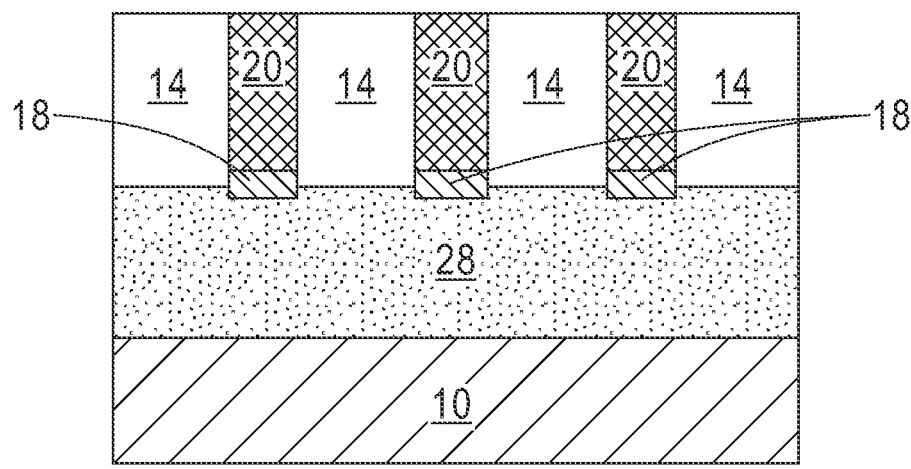
FIG. 8B is a cross sectional view of the exemplary semiconductor structure of FIG. 8A along vertical plane B-B'.

Referring now to FIGS. 8A-8B, there are illustrated the exemplary semiconductor structure of FIGS. 7A-7B after removing the anchoring structure 22. In one embodiment, the anchoring structure 22 may be removed by an etching process. In another embodiment, the anchoring structure 22 can be removed by a planarization process such as, for example, chemical mechanical polishing and/or grinding. The removal of the anchoring structure 22 exposes the topmost surface of each second hard mask portion 14 and a topmost surface of the second silicon germanium alloy fin portion 20.

Figure 9A:
FIG. 9A is top down view of the exemplary semiconductor structure of FIGS. 8A-8B after forming a hard mask layer atop each second hard mask portion and the second silicon germanium alloy fin portion.
Figure 9B:
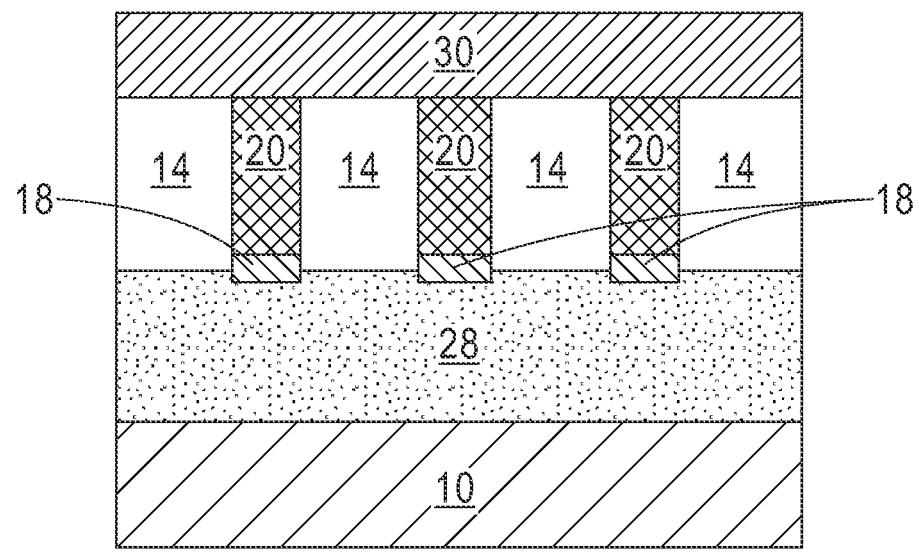
FIG. 9B is a cross sectional view of the exemplary semiconductor structure of FIG. 9A along vertical plane B-B'.

Referring now to FIGS. 9A-9B, there are illustrated various views of the exemplary semiconductor structure of FIGS. 8A-8B after forming a hard mask layer 30 atop each second hard mask portion 14 and the second silicon germanium alloy fin portion 20. In one embodiment of the present application, the hard mask layer 30 may comprise a same hard mask material as the hard mask material that provides each second hard mask portion 14. For example, each second hard mask portion 14 and the hard mask layer 30 may comprise silicon nitride. In another embodiment of the present application, the hard mask layer 30 may comprise a different hard mask material as the hard mask material that provides each second hard mask portion 14. For example, each second hard mask portion 14 may comprise silicon nitride, while the hard mask layer 30 may comprise silicon dioxide and/or silicon oxynitride.

The hard mask layer 30 is a continuous layer that can be formed utilizing a conventional deposition process such as, for example, chemical vapor deposition or plasma enhanced chemical vapor deposition. The hard mask layer 30 can have a thickness from 5 nm to 20 nm. Other thicknesses that are lesser than, or greater than, the aforementioned thickness range can also be employed as the thickness of hard mask layer 30.

Figure 10A:
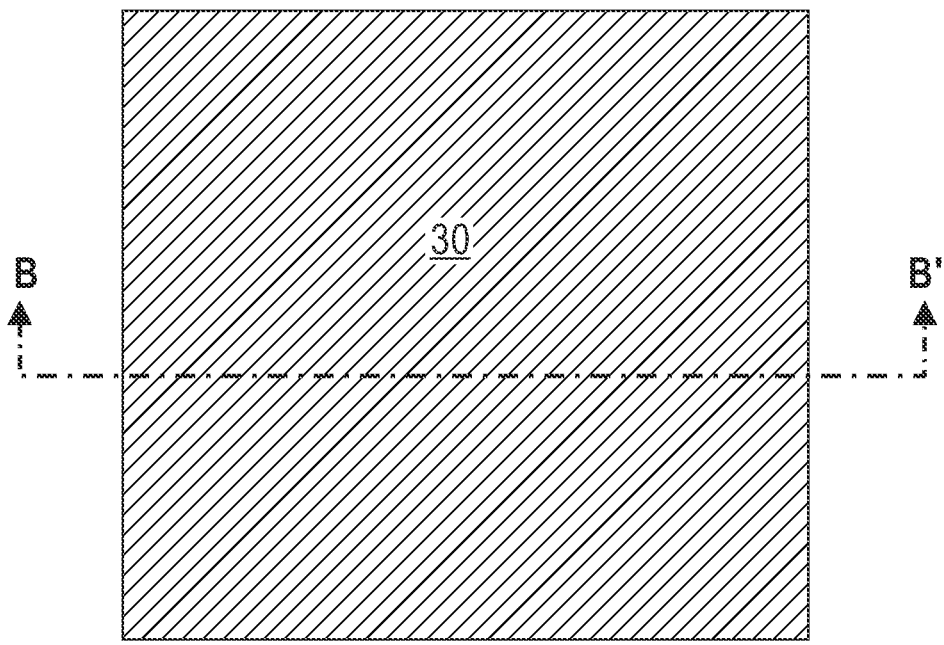
FIG. 10A is a top down view of the exemplary semiconductor structure of FIGS. 9A-9B after performing a flash laser anneal, the flash laser anneal melts and recrystallizes the second silicon germanium alloy fin portion into a silicon germanium alloy pre-fin structure having the first germanium content.
Figure 10B:
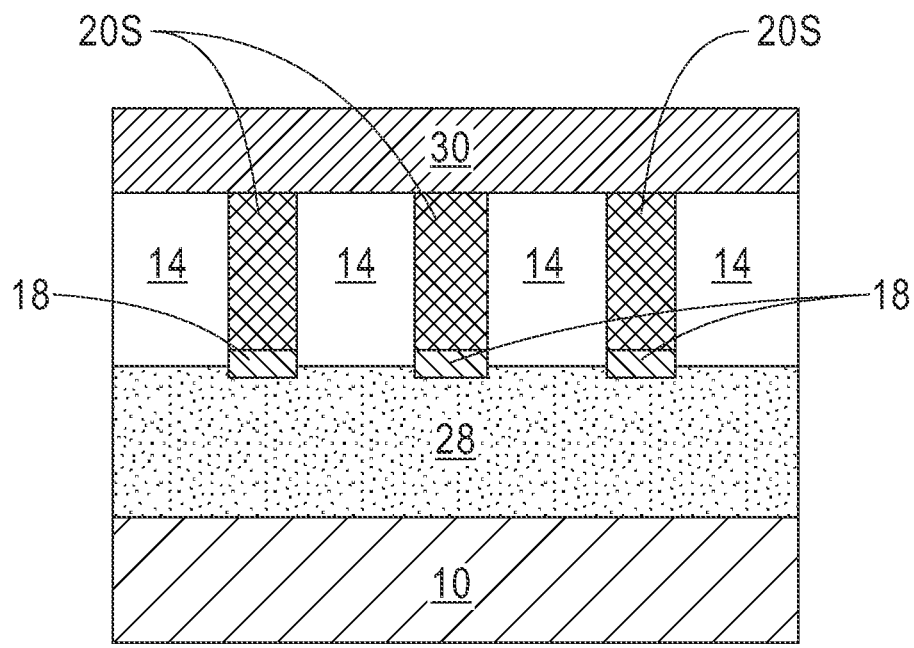
FIG. 10B is a cross sectional view of the exemplary semiconductor structure of FIG. 10A along vertical plane B-B'.

Referring now to FIGS. 10A-10B, there are illustrated various views of the exemplary semiconductor structure of FIGS. 9A-9B after performing a flash laser anneal process. The flash laser anneal process melts and recrystallizes the second silicon germanium alloy fin portion 20 into a silicon germanium alloy pre-fin structure 20S having the first germanium content. No melting of the silicon fin portion 18 occurs during the flash laser anneal. During recrystallization, the defect density with the second silicon germanium alloy fin portion 20 is reduced or even eliminated. In one embodiment, the resultant silicon germanium alloy pre-fin structure 20S has a defect density that is from 1E2 or less defects per square cm; typically from 1E1 to 1E2 defects per square cm. In addition, the resultant silicon germanium alloy pre-fin structure 22S has a relaxation from 80% to 1000%.

In one embodiment of the present application, the flash laser anneal is performed at a temperature from 1050° C. to 1100° C. Other temperatures that melt the silicon germanium alloy fin portion 20, but not the silicon fin portion 18 can be used in the present application. In one embodiment of the present application, the flash laser anneal can be performed for a duration of from 100 nanoseconds to 500 nanoseconds.

Figure 11A:
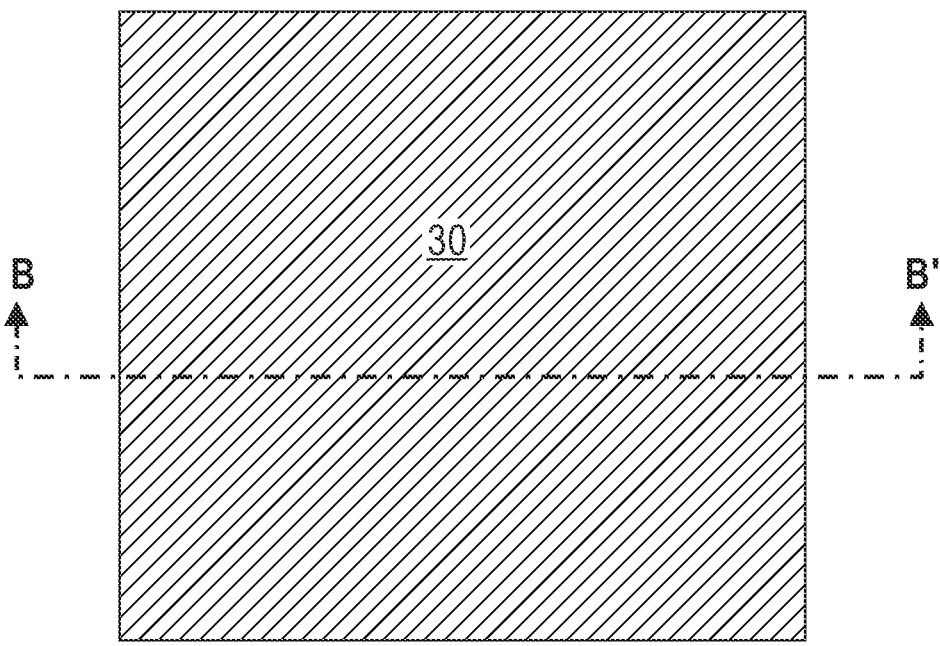
FIG. 11A is a top down view of the exemplary semiconductor structure of FIGS. 10A-10B after performing a thermal mixing process that converts the silicon germanium alloy pre-fin structure and the underlying silicon fin portion into a silicon germanium alloy fin structure having a second germanium content that is less than the first germanium content.
Figure 11B:
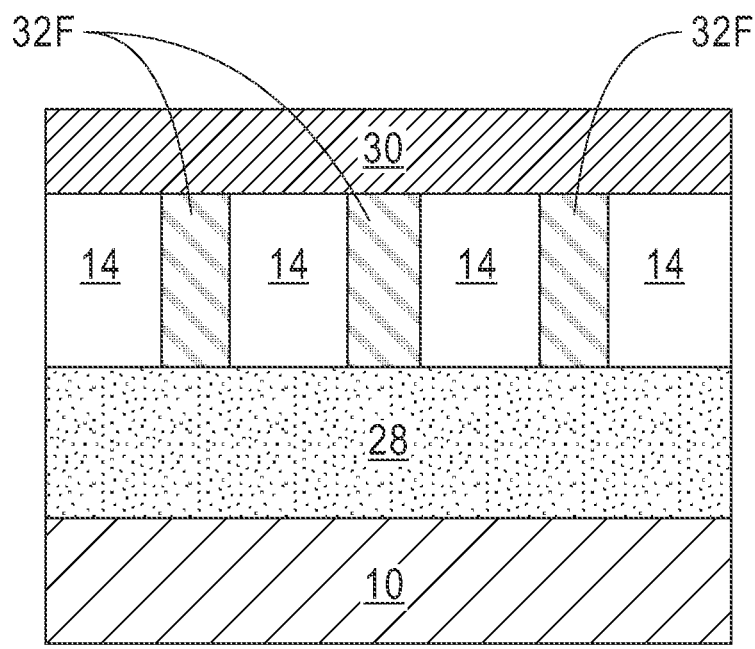
FIG. 11B is a cross sectional view of the exemplary semiconductor structure of FIG. 11A along vertical plane B-B'.

Referring now to FIGS. 11A-11B, there are illustrated various views of the exemplary semiconductor structure of FIGS. 10A-10B after performing a thermal mixing process that converts the silicon germanium alloy pre-fin structure 20S and the underlying silicon fin portion 18 into a silicon germanium alloy fin structure 32F having a second germanium content that is less than the first germanium content.

The second germanium content of the silicon germanium alloy fin structure 32F is from 50 atomic percent or greater. In one embodiment of the present application, the second germanium content is 50 atomic percent to 90 atomic percent.

In addition to having a high germanium content, the silicon germanium alloy fin structure 32F has a relaxation value from 80% to 100%. Also, the silicon germanium alloy fin structure 32F has a low defect density that is from 1E2 or less defects per square cm; typically from 1E1 to 1E2 defects per square cm. In some embodiments, no defects are present in the silicon germanium alloy fin structure 32F. The silicon germanium alloy fin structure 32F that is formed has a bottommost surface directly contacting a surface of the insulator layer 28 and the height of the silicon germanium alloy fin structure 32F equals the sum of the height of the silicon fin portion 18 and the height of the overlying silicon germanium alloy pre-fin structure 22S. The height of the silicon germanium alloy fin structure 32F of the present application is greater than the critical thickness of a respective silicon germanium alloy layer that is grown on a silicon substrate.

The thermal mixing process of the present application may also be referred to as a thermal anneal process. During thermal annealing, Si atoms from the silicon fin portion 18 diffuse upwards and into the silicon germanium alloy pre-fin structure 22S diluting those portions of the silicon germanium alloy pre-fin structure 22S providing an upper portion of the silicon germanium alloy fin structure 32F. Also, and during the thermal mixing, Ge atoms are diffused from the silicon germanium alloy pre-fin structure 22S into the silicon fin portion 18 adding Ge into the silicon fin portion 14 forming a bottom portion of the silicon germanium alloy fin structure 32F.

The thermal mixing process of the present application can be carried out in an inert ambient such as, for example, He, Ar and/or Ne. The thermal mixing process of the present application can be performed at a temperature from 800° C. to 1350° C. The thermal mixing process of the present application may include a furnace anneal, a rapid thermal anneal or any other anneal that can form the exemplary semiconductor structure shown in FIGS. 11A-11B.

Figure 12A:
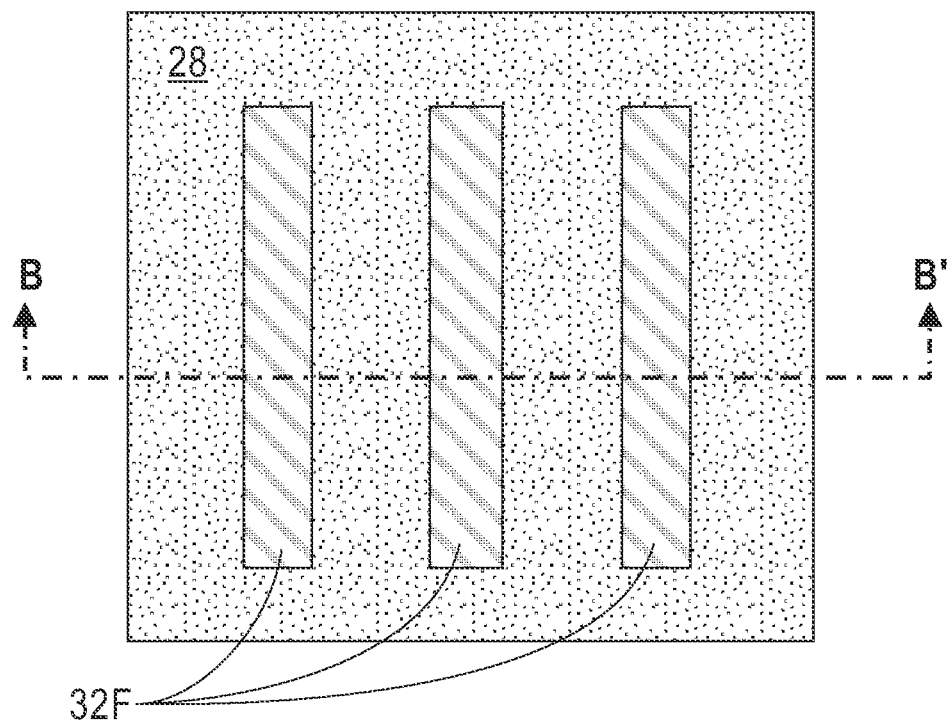
FIG. 12A is a top down view of the exemplary semiconductor structure of FIGS. 11A-11B after removing the hard mask layer and each second hard mask portion.
Figure 12B:
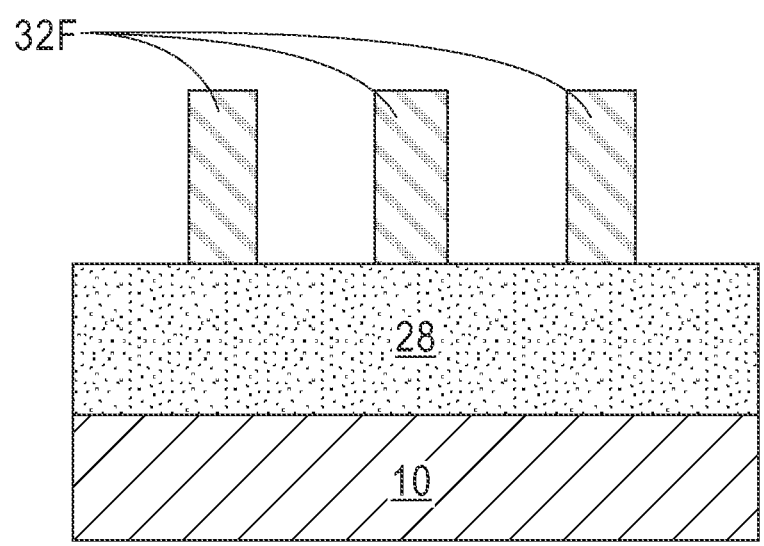
FIG. 12B is a cross sectional view of the exemplary semiconductor structure of FIG. 12A along vertical plane B-B'.

Referring now to FIGS. 12A-12B, there are illustrated various views of the exemplary semiconductor structure of FIGS. 11A-11B after removing the hard mask layer 30 and each second hard mask portion 14. In one embodiment, and when the hard mask layer 30 and each second hard mask portion 14 comprise a same hard mask material, a single removal process such as etching can be used to remove the hard mask layer 30 and each second hard mask portion 14. In another embodiment, and when the hard mask layer 30 comprises a different hard mask material than each second hard mask portion 14, a first removal process such as etching or planarization can be used to remove the hard mask layer 30. Following the removal of the hard mask layer 30, a second removal process such as, for example, another etch, can be used to remove each second hard mask portion 14. The removal of the hard mask layer 30 and each second hard mask portion 14 exposes a topmost surface and sidewall surfaces of each silicon germanium alloy fin structure 32F.

Figure 13A:
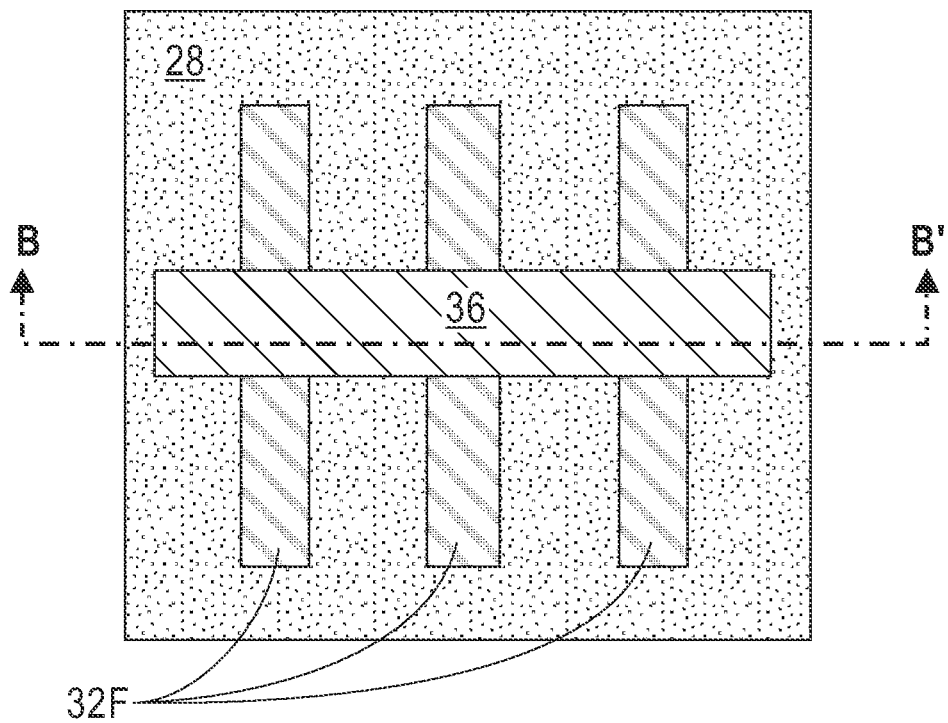
FIG. 13A is a top down view of the exemplary semiconductor structure of FIGS. 12A-12B after forming a functional gate structure straddling each silicon germanium alloy fin structure.
Figure 13B:
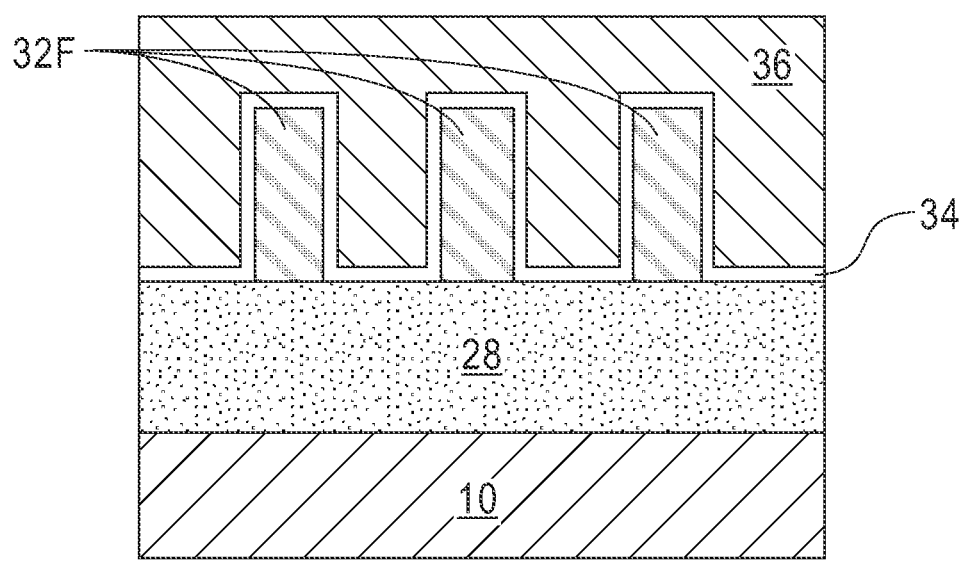
FIG. 13B is a cross sectional view of the exemplary semiconductor structure of FIG. 11A along vertical plane B-B'.

Referring now to FIGS. 13A-13B, there are illustrated the exemplary semiconductor structure of FIGS. 12A-12B after forming a functional gate structure (34, 36) straddling over each silicon germanium alloy fin structure 32F. By "functional gate structure" it is meant a permanent gate structure used to control output current (i.e., flow of carriers in the channel) of a semiconducting device through electrical or magnetic fields. Although a single functional gate structure is described and illustrated, a plurality of functional gate structures can be formed straddling over different portions of each silicon germanium alloy fin structure 32F.

Each functional gate structure includes a gate material stack of, from bottom to top, a gate dielectric portion 34 and a gate conductor portion 36. In some embodiments, a gate cap portion (not specifically shown) can be present atop each gate conductor portion 36.

The gate dielectric portion 34 of the functional gate structure comprises a gate dielectric material. The gate dielectric material that provides the gate dielectric portion 34 can be an oxide, nitride, and/or oxynitride. In one example, the gate dielectric material that provides the gate dielectric portion 34 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 34. In some embodiments, the gate dielectric portion 34 comprises a same gate dielectric material. In other embodiments, a first set of functional gate structures comprises a first gate dielectric material while a second set of functional gate structures comprises a second gate dielectric material that differs from the first gate dielectric material.

The gate dielectric material used in providing the gate dielectric portion 34 can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the gate dielectric portion 34 can have a thickness in a range from 1 nm to 10 nm. Other thicknesses that are lesser than, or greater than, the aforementioned thickness range can also be employed for the gate dielectric material.

The gate conductor portion 36 of the functional gate structure comprises a gate conductor material. The gate conductor material used in providing the gate conductor portion 36 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 36 comprises a same conductive material. In other embodiments, the gate conductor portion of a first set of functional gate structures comprises a different gate conductor material than a gate conductor portion of a second set of functional gate structures. For example, the gate conductor portion of a first set of functional gate structures may comprise an nFET gate metal, while the gate conductor portion of a second set of functional gate structures may comprise a pFET gate metal.

The gate conductor material used in providing the gate conductor portion 36 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the gate conductor portion 36 has a thickness from 1 nm to 100 nm. Other thicknesses that are lesser than, or greater than, the aforementioned thickness range can also be employed for the gate conductor material used in providing the gate conductor portion 36.

If present, the gate cap portion of the functional gate structure comprises a gate cap material. The gate cap material that provides the gate cap portion may include a hard mask material such as, for example, silicon dioxide, silicon nitride, and/or silicon oxynitride. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

The functional gate structure can be formed by providing a functional gate material stack of, from bottom to top, the gate dielectric material, the gate conductor material and, if present, the gate cap material. The gate material stack can then be patterned. In one embodiment of the present application, patterning of the functional gate material stack may be performed utilizing lithography and etching, as defined above.

In other embodiments of the present application, and prior to forming functional gate structure, a sacrificial gate structure is formed instead of a functional gate structure. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed.

In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the gate dielectric portion. Each sacrificial gate material portion includes one of the gate conductor materials mentioned above for the gate conductor portion. The sacrificial gate cap portion includes one of the gate cap materials mentioned above for each gate cap portion. The sacrificial gate structures can be formed by deposition of the various material layers and then patterning the resultant sacrificial dielectric material sack by utilizing, for example, lithography and etching.

After forming the gate structures (functional and/or sacrificial gate structures), a dielectric spacer (not shown) can be formed on exposed sidewall surfaces of the respective functional gate structure (34, 36) and straddling over other portions of the silicon germanium alloy fin structure 32F. The dielectric spacer may comprise a spacer dielectric material such as, for example, silicon dioxide and/or silicon nitride. The dielectric spacer can be formed by depositing a spacer material and thereafter a spacer etch can be performed. At this point of the present application, a source region and a drain region (both not shown in the drawings) can be formed on opposite sides of the functional gate structure. The source region and drain region can be formed by epitaxially growing (or depositing) an epitaxial semiconductor material on the exposed portions of the silicon germanium alloy fin structure 32F not protected by the functional gate structure or spacer. In one embodiment, a p-type dopant or n-type dopant can be introduced into the precursor gas source that provides the epitaxial semiconductor material. In another embodiment, the p-type dopant or n-type dopant can be introduced in an intrinsically grown epitaxial semiconductor material by utilizing, for example, ion implantation or gas phase doping.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    forming an epitaxial semiconductor material fin stack comprising, from bottom to top, a first silicon germanium alloy fin portion of a first germanium content, a silicon fin portion and a second silicon germanium alloy fin portion of said first germanium content within at least one opening formed within a patterned material stack comprising, from bottom to top, first hard mask portions and second hard mask portions, said opening exposing a surface of a silicon substrate;
    forming an anchoring structure on said patterned material stack and said epitaxial semiconductor material stack;
    replacing each first hard mask portion and said first silicon germanium alloy fin portion with an insulator layer;
    removing said anchoring structure;
    performing a flash laser anneal to melt and recrystallize said second silicon germanium alloy fin portion and to provide a silicon germanium alloy pre-fin structure having said first germanium content; and
    performing a thermal mixing process to convert said silicon germanium alloy pre-fin structure and said silicon fin portion into a silicon germanium alloy fin structure having a second germanium content that is less than said first germanium content.

2. The method of claim 1, further comprising forming a hard mask layer on said patterned material stack and said epitaxial semiconductor material fin stack after said removing said anchoring structure and prior to said performing said flash laser anneal.

3. The method of claim 1, wherein said first silicon germanium alloy fin portion has a first defect density and said second silicon germanium alloy fin portion has a second defect density that is less than the first defect density.

4. The method of claim 3, wherein said silicon germanium alloy pre-fin structure has a defect density that is less than said second defect density of said second silicon germanium alloy fin portion.

5. The method of claim 1, wherein said first germanium content is greater than 50 atomic percent, and said second germanium content is 50 atomic percent or greater.

6. The method of claim 1, wherein said forming said epitaxial semiconductor material fin stack comprises epitaxial growth and wherein defects within said first silicon germanium alloy fin portion are trapped along sidewalls of each first hard mask portion.

7. The method of claim 1, wherein said silicon fin portion is located at an interface formed between said second hard mask portions and said first hard mask portions.

8. The method of claim 1, wherein said flash laser anneal does not melt said silicon fin portion.

9. The method of claim 8, wherein said flash laser anneal is performed at a temperature from 1050° C. to 1100° C.

10. The method of claim 1, wherein said insulator layer has a bottommost surface directly contacting said silicon substrate and a topmost surface that directly contacts a bottommost surface of each second hard mask portion and a bottommost surface of said silicon fin portion.

11. The method of claim 1, wherein said replacing each first hard mask portion and said first silicon germanium alloy fin portion with said insulator layer comprises:
    first removing each first hard mask portion utilizing a directional etching process to expose sidewall surfaces of said first silicon germanium alloy fin portion;
    second removing said first silicon germanium alloy fin portion utilizing an etch to provide a gap between said silicon substrate and said second hard mask portions and silicon fin portion; and
    filling said gap with a dielectric material, said dielectric material is different from a dielectric material used to provide said second hard mask portions.

12. The method of claim 11, wherein said dielectric material is a flowable oxide, and said second hard mask portions comprise silicon nitride.

13. The method of claim 1, wherein said thermal mixing process is performed at a temperature from 800° C. to 1350° C. and in inert ambient.

14. The method of claim 1, further comprising removing each second hard mask portion to expose said silicon germanium alloy fin structure.

15. The method of claim 14, further comprising forming a functional gate structure straddling over a portion of said silicon germanium alloy fin structure.

16. The method of claim 14, further comprising forming a sacrificial gate structure straddling over a portion of said silicon germanium alloy fin structure, and replacing said sacrificial gate structure with a functional gate structure.

17. The method of claim 1, wherein said first hard mask portions comprise silicon oxide, and said second hard mask portions comprise silicon nitride.

18. The method of claim 2, further comprising removing said hard mask layer and said second hard mask portions to expose said silicon germanium alloy fin structure.

19. The method of claim 18, wherein said removing said hard mask layer and said second hard mask portions comprises a single etching process.

20. The method of claim 18, wherein removing said hard mask layer and said second hard mask portions comprises first removing said hard mask layer utilizing a first removal process, and thereafter removing said second hard mask portions utilizing a second removal process.

* * * * *